US012704469B2

(12) United States Patent
Kellogg et al.

(10) Patent No.: US 12,704,469 B2
(45) Date of Patent: Aug. 11, 2026

(54) PARTICLE-INDUCED X-RAY EMISSION USING LIGHT AND HEAVY PARTICLE BEAMS

(71) Applicant: FEI Company, Hillsboro, OR (US)

(72) Inventors: Sean M. Kellogg, Portland, OR (US); Aurelien Philippe Jean Maclou Botman, Hillsboro, OR (US); Daniel Totonjian, Portland, OR (US)

(73) Assignee: FEI COMPANY, Hillsboro, OR (US)

( * ) Notice: Subject to any disclaimer, the term of this patent is extended or adjusted under 35 U.S.C. 154(b) by 432 days.

(21) Appl. No.: 18/530,756

(22) Filed: Dec. 6, 2023

(65) Prior Publication Data

US 2025/0189469 A1 Jun. 12, 2025

(51) Int. Cl.
*G01N 23/2257* (2018.01)
*H01J 37/244* (2006.01)

(52) U.S. Cl.
CPC ........ *G01N 23/2257* (2013.01); *H01J 37/244* (2013.01); *G01N 2223/0813* (2013.01); *G01N 2223/104* (2013.01)

(58) Field of Classification Search
None
See application file for complete search history.

(56) References Cited

U.S. PATENT DOCUMENTS 4,637,869 A * 1/1987 Glocker .................. C23C 14/46 136/258
2023/0341341 A1 10/2023 Totonjian et al.

FOREIGN PATENT DOCUMENTS

CN 117174558 A 12/2023
JP 08088098 2/1996
WO WO-2006011677 A1 * 2/2006 ......... G01N 23/2257

OTHER PUBLICATIONS

EP24217817.6, Extended European Search Report, May 6, 2025, 5 pages.

Johannsson et al. "Analytical Application of Particle Induced X-ray Emission" Nuclear Instruments and Methods, 1976, vol. 137, pp. 473-516.

Miranda, Javier "Low energy PIXE: advantages, drawbacks, and applications" Nuclear Instruments and Methods in Physics Research B, 1996, vol. 118, pp. 346-351.

Miranda, J. "Low energy PIXE revisited: is it still alive?" Revista Mexicana De Física S, Aug. 11, 2009, vol. 56, No. 1, pp. 81-84.

(Continued)

*Primary Examiner* — Eliza W Osenbaugh-Stewart
(74) *Attorney, Agent, or Firm* — Thomas F. Cooney

(57) ABSTRACT

A method of Particle-Induced X-Ray Emission (PIXE) analysis comprises: (a) delivering a first ion beam from a first ion source and comprising ions having a first composition onto an area of a sample, wherein the kinetic energy of the ions is not greater than 50 kilo-electron-Volts (keV); (b) simultaneously with the delivering of the first ion beam onto the sample area, delivering a second ion beam from a second ion source onto the sample area, the second ion beam comprising ions having a second composition, wherein the kinetic energy of the ions of the second ion beam is not greater than 50 keV; and (c) detecting X-rays that are emitted from the sample area in response to the simultaneous delivery of the first and second ion beams thereto.

20 Claims, 14 Drawing Sheets

200a

Computer / Controller 230

(56) References Cited

OTHER PUBLICATIONS

El-Ghawi et al. "Possibility of Using a Low-Energy Proton Beam for Particle-Induced X-Ray Emission Microanalysis" Radiation Research, Sep. 1992, vol. 131, No. 3, pp. 243-248.
Teesdale et al. "Limits of Detection and Quantitation in PIXE Analysis of Thich Targets" Nuclear Instruments and Methods in Physics Research B35, 1988, pp. 57-66.
Corrêa et al. "A multipurpose set-up using keV ions for nuclear reaction analysis, high-resolution backscattering spectrometry, low-energy PIXE and in-situ irradiation experiments" Nuclear Instruments and Methods in Physics Research. Section B: Beam Interactions With Materials and Atoms, Jun. 5, 2020, vol. 478, pp. 104-110.
Joy et al. "On the Production of X-rays by Low Energy Ion Beams" Scanning, Jan. 2007, vol. 29, No. 1, pp. 1-4.
Reis et al. "CdTe and EDS HR-PIXE Ta L and M spectra induced by duoplamatron generated proton and oxygen ion beams" Nuclear Instruments and Methods in Physics Research, Section B: Beam Interactions With Materials and Atoms, Feb. 1, 2018, vol. 417, No. 1, pp. 32-36.

* cited by examiner

PARTICLE-INDUCED X-RAY EMISSION USING LIGHT AND HEAVY PARTICLE BEAMS

CROSS REFERENCE TO RELATED APPLICATION

This application is related to co-pending and co-assigned U.S. patent application Ser. No. 17/728,869, titled "Particle-Induced X-Ray Emission (PIXE) Using Hydrogen and Multi-Species Focused Ion Beams", which was filed on Apr. 25, 2022, the disclosure of which is hereby incorporated by reference herein in its entirety.

TECHNICAL FIELD

The present invention relates to focused ion beam apparatuses and methods of use of such apparatuses. More particularly, the present invention relates to elemental analyses of samples, using the method of particle-induced X-ray emission, by two or more ion beams, a first beam comprising protons or other light ions and a second beam comprising a different ion species where both beams re directed at a specimen simultaneously or essentially simultaneously. The present invention may be embodied in focused-ion beam apparatuses including both stand-alone focused ion beam apparatuses as well as dual-beam apparatuses that also include scanning electron microscopy capability.

BACKGROUND

Focused Ion Beam (FIB) instruments are a staple of sample preparation, nanofabrication, and materials analysis. Although stand-alone FIB apparatuses are known, they are typically employed as components of dual-beam or triple-beam microscopes in combination with a scanning electron microscope (SEM) component [1] and more recently, in combination with a femtosecond laser ablation system component. [2] FIB instruments dominate semiconductor fabrication and processing applications in the middle ground between small scale electron beam processing and large-scale bulk processing, where the focused beam allows the mask-free processing of small-size features that are inaccessible to bulk processing such as reactive ion etching (RIE). In such applications, FIB apparatuses provide a throughput that is significantly higher than that offered by processing using an electron beam such as electron beam lithography and focused electron beam induced processing (FEBIP). [3,4] For this reason, FIB instruments typically find use in industrial applications such as semiconductor failure analysis where cross sectioning, tomography or TEM lamella preparation is required on a relatively small scale, and high throughput is fundamental for cost reasons. Focused Ion Beam apparatuses also find a place in research and development, with such applications as the preparation of biological samples for cryo-TEM analysis, preparation of samples for atom probe tomography, or fabrication of optical components such as solid immersion lenses. As such, the FIB instrument is ubiquitous and can be found in a large number of factories and labs across the world. [3,5,6,7]

An FIB apparatus resembles and may be employed in a similar fashion to a scanning electron microscope. In operation of either such apparatus, a tightly focused beam of charged particles is caused to scan or raster across the surface of a sample of interest. The impingement of the energy of the beam onto the surface of the sample induces either backscattering of particles or the emission of secondary charged particles (ions or electrons) from each respective focal point. The backscattered or emitted particles from each respective point may be detected by a particle detector that provides a measure of the relative quantity of particles detected from each point. The number of such particles that can be detected, and thus the signal intensity, can depend on sample topography and composition. In this way, a map of sample topography and/or composition may be developed. However, whereas an SEM utilizes a focused electron beam to image samples, an FIB instead utilizes a focused beam of ions. Because of this difference in beam composition, FIB apparatuses generate images of somewhat lower resolution than SEM images and, in contrast to SEM apparatuses, can cause damage to a sample through a process of sputtering. Nonetheless, the sputtering process may be used to advantage in micro-etching or micro-milling applications. Thus, many dual-beam systems comprise both an FIB component or subsystem together with an SEM component or subsystem. In such dual-beam systems, the SEM portion may be used to monitor, through its imaging capability, a micro-etching or micro-milling procedure that is conducted by the FIB portion.

Of particular interest to the present disclosure is the technique of particle induced X-Ray emission (PIXE). This technique is ideal for trace-element analysis, where a sample composition can be determined with a sensitivity at or below 1 part per million [8,9], particularly when compared to similar X-Ray spectroscopic techniques such as energy dispersive spectroscopy performed in a scanning electron microscope (SEM-EDS), with a sensitivity of 100-500 ppm. [10] The PIXE analysis technique is typically performed by detecting emitted X-rays while bombarding a sample surface with a beam of ions. In theory, the beam may comprise ions of any type. However, in practice, very light ions such as protons are employed due to their high velocity under a given acceleration potential, as the X-ray production cross section (XRPCS) is proportional to ion velocity. Although heavier ions could be employed, a very high accelerating potential would be required to match the proton velocity [11] and significant sample damage could be incurred [12].

Typically, the PIXE analysis technique is performed at incident particle energies of several mega electron-volts (MeV) since X-Ray production cross sections are significantly increased at such high energies [13]. The optimal energy range for PIXE has been found to be 3 MeV at which the X-Ray production cross sections are maximized while the background contributions remain sufficiently low. [14] These high primary ion energies, however, have thus far restricted the employment of the PIXE technique to particle accelerator facilities, which are limited in terms of availability and cost. The result is that the PIXE technique can, at present, be somewhat inaccessible to general lab users.

The ability to perform PIXE on a focused ion beam instrument would signify a large step in the progression of the PIXE technique, opening the availability of PIXE to a range of additional facilities and providing a complementary technique to SEM-EDS, thereby affording significantly improved sensitivity to trace elements. Co-pending and co-assigned U.S. patent application Ser. No. 17/728,869, which was filed on Apr. 25, 2022, describes a new method of particle induced X-Ray emission, referred to as Very Low Energy PIXE (VLE-PIXE). The inventors of the co-pending application made the surprising discovery that the number of X-ray photons that are emitted from a patch of sample that is bombarded with a flux of hydrogen ions ($H^+$) may be greatly enhanced and thereby detected by also causing the same patch of the sample to be also bombarded, simultaneously or nearly simultaneously, with a flux of heavy ions (such as $Ar^+$, $Kr^+$, $Xe^+$), where the incident-particles' kinetic energy is ≤50 keV. This very low energy range makes PIXE analysis available to standard commercial FIB instruments. The inventors of U.S. patent application Ser. No. 17/728,869 showed that X-ray signal enhancement requires the simultaneous interaction of both the light ions and heavy ions with the sample. However, the exact electronic mechanism by which the X-ray signal is enhanced remains an area of active research.

To demonstrate the VLE-PIXE phenomenon, the inventors of U.S. patent application Ser. No. 17/728,869 utilized a known FIB apparatus, as described in U.S. Pat. Nos. 8,076,650 and 8,822,913, that was outfitted with an inductively-coupled plasma (ICP) ion source and a gas mixing apparatus. Such an apparatus is sometimes referred to as a Plasma Focused Ion Beam (PFIB) apparatus. According to the methods taught in U.S. patent application Ser. No. 17/728,869, the ion source was modified for use with hydrogen.

FIGS. 1A-1C, which are here reproduced from the aforementioned co-pending US Patent application, schematically depict examples of apparatuses and devices by which VLE-PIXE may be implemented, as described in that application. In both the apparatus 1*a* (FIG. 1A) and the apparatus 1*b* (FIG. 1B), an FIB column 6 that is housed within a vacuum chamber 13 receives a mixture of ions, comprising at least hydrogen ions (i.e., protons) 2 as well as ions 3 that are heavier than protons, from an inductively-coupled plasma ion source 4 that includes a coiled electrode 5 to which, in operation, a radio-frequency (RF) voltage waveform is applied. The ions are generated from a gas that is received from a gas inlet tube 11 and that comprises a mixture of hydrogen, comprising hydrogen molecules 2*m* and at least one other non-hydrogen gas comprising molecules 3*m*. The different gases may be provided in purified form and mixed, in appropriate proportions in a gas-mixing manifold (see FIG. 1C) prior to their introduction into the gas inlet tube 11. Alternatively, the gases may be provided in pre-mixed form, thereby eliminating the need for the gas-mixing manifold as well as any metering valves required for the proportional mixing. Application of an appropriate RF voltage to the coiled electrode 5 causes ignition of a plasma within the ion source 4 in known fashion.

With continued reference to FIGS. 1A-1B, the ions 2, 3 are focused into a beam 7 and are guided along the length of the FIB column 6 towards a beam focal point on the surface of a sample 8 by electric and or magnetic fields applied to a series of ion optics 15 that may comprise ion lenses and ion guides. The ion optics accelerate the ions towards the sample and cause the mixture of light and heavy ions of the ion beam to impact the sample surface with kinetic energy of less than or equal to 50 keV. The impingement of both the protons 2 and the heavier ions 3 onto the same region of the sample 8 causes generation of a measurable quantity of X-ray photons 9 that are derived, in known fashion, by ejection of inner-shell electrons of atoms of the sample and filling of the resulting electron hole by electrons from higher-energy electron shells. The resulting X-rays are detected by an energy dispersive X-ray detector 10 and recorded as an energy-dispersive spectrum. In this fashion, the elemental composition of the sample may be determined. The apparatus 1*b* further includes a scanning electron microscope (SEM) column 12 within the vacuum chamber that is employed so as to direct and focus a beam of electrons onto the sample. Detection of secondary or backscattered electrons by an electron detector (not shown) may be used to create an image of the area of the sample, in known fashion.

FIG. 1C is a schematic depiction of ion source 100 as used in such a PFIB apparatus (see also U.S. Pat. Nos. 8,076,650 and 8,822,913). A pre-determined gas mixture is provided by a gas mixing system 220. The gas mixture is provided to a plasma chamber 102 within a source tube 103 from an external gas feed line 104 through a gas filter 106 and then to a capillary tube 108 with a flow restriction 110. Energy is fed into the plasma chamber 102 from RF power supply 113 by antenna coils 114 and ions are extracted through a source electrode aperture 116 in a source electrode 118 by extractor electrode 120. A split Faraday shield 121 reduces the capacitive coupling between the coil 114 and the plasma in chamber 102, in chamber 102 which reduces the energy spread of the extracted ions. Power supply 113 preferably drives the antenna 114 in a "balanced" manner, that is, the electrical phase shift across the antenna is adjusted to reduce modulation of the plasma potential as described in U.S. Pat. No. 7,670,455 which is hereby incorporated herein by reference. The balanced antenna preferably provides a null point in the radio frequency energy field within the plasma, which reduces the energy spread of the ions extracted from plasma chamber 102.

The gas conductance into and out of the plasma chamber 102 is through the flow restriction 110 in the capillary tube (at the top of the source tube 103) and the aperture 116 (typically less than ¼ mm in diameter) in the source electrode 118. Pump 122 connected to gas supply line 104 through valve 123 removes gas from plasma chamber 102 through capillary 108 and gas supply line 104. An ion column pump (not shown) extracts gas from plasma chamber 102 through source electrode aperture 116.

The gas mixing system 220 receives gases from multiple gas sources such as gas storage 130A, gas storage 130B, gas storage 130C and gas storage 130D supply gas into gas supply line 104 through corresponding valves 131A through 131D. Valves 131A to 131D are adjusted to provide the desired gas mixture into gas feed line 104 to provide gas to the plasma chamber 106. Multiple ones of valves 131A to 131D may be open at the same time to provide multiple gas species to the plasma chamber simultaneously. Valves 131A to 131D are preferably metering valves that control the ratio of gases into gas inlet 104. A beam voltage supply 132 supplies a high voltage to the plasma in chamber 102 and an extraction voltage supply 134 supplies a voltage to extraction electrode 120. Extracted ions or electrons are focused by focusing electrode 136. Additional details of the focusing column and sample chamber are not shown.

FIGS. 2A-2B show comparisons between VLE-PIXE spectra and conventional SEM-EDS spectra of NIST Standard Reference Material SRM 654b, using the methods of U.S. patent application Ser. No. 17/728,869. Spectrum 351 of FIG. 2A is a 5 keV SEM-EDS spectrum of the same sample. This may be compared with spectrum 352 of FIG. 2A, which is a portion of a 24 keV VLE-PIXE spectrum of the same sample obtained using a single focused ion beam comprising protons ($H^+$ ions) doped with $Xe^+$ ions (denoted as an H/Xe ion beam). FIG. 2B shows VLE-PIXE and SEM-EDS spectra of the same sample using greater acceleration voltages. Spectrum 353 is a 30 keV SEM-EDS spectrum of the sample. Spectrum 354 is another portion of the 24 keV H/Xe VLE-PIXE spectrum. The SEM-EDS spectrum continues up to a value of 30 keV. However, only Bremsstrahlung background is observed in the SEM-EDS spectra at an energy greater than 10 keV; therefore, the spectra are truncated for clarity.

FIGS. 3A-3B show comparisons between VLE-PIXE spectra and conventional SEM-EDS spectra of NIST Standard Reference Material SRM 1242, using the methods of U.S. patent application Ser. No. 17/728,869. Spectrum 355 of FIG. 3A is a 5 keV SEM-EDS spectrum of the sample. This may be compared with spectrum 356 of FIG. 3A, which is a portion of a 24 keV VLE-PIXE spectrum of the same sample obtained using a single beam comprising $Xe^+$-doped protons. FIG. 3B shows VLE-PIXE and SEM-EDS spectra of the same sample using greater acceleration voltages. Spectrum 357 is a 30 keV SEM-EDS spectrum of the sample and spectrum 358 is another portion of the 24 keV H/Xe VLE-PIXE spectrum.

Qualitatively, the VLE-PIXE spectra of FIGS. 2A-2B and 3A-3B can be characterized by the almost complete absence of Bremsstrahlung background, in contrast to the broad, intense Bremsstrahlung background typical of the SEM-EDS spectra. An example of this Bremsstrahlung background is labelled in FIG. 2A. As a result, several peaks are present in the VLE-PIXE spectrum which cannot be identified in the SEM-EDS spectrum, leading to the identification of two additional minor components; Ni and Cu. Ni can be identified in the VLE-PIXE spectrum based on the presence of the Ni $L\alpha$ peak, and the Ni $K_\alpha$ and $K_\beta$ peaks. Cu can be identified in the VLE-PIXE spectrum based on the Cu $L_\alpha$ peak.

FIGS. 4-6 depict the analytical effectiveness of the VLE-PIXE technique that is described in U.S. patent application Ser. No. 17/728,869. FIG. 4 is a graphical representation of X-ray signal enhancement factors, relative to an ion beam composed of >99% hydrogen, of several X-ray peaks of NIST Standard Reference Material SRM 654b, as observed for light doping of the beam with nitrogen, argon and xenon dopants. FIG. 5 is a plot of the measured intensities of some prominent X-ray peaks generated by repeated exposure of a sample of NIST Standard Reference Material SRM 654b to hydrogen ion beams having progressively decreasing percentages of Ar dopant, the Ar percentages controlled by repeated plasma source evacuation cycles. FIG. 6 is histogram that compares lower limits of detection of several elements in NIST Standard Reference Material SRM 654b, as determined by SEM-EDS to the lower limits of detection of the same elements as determined by Xe-doped hydrogen ion VLE PIXE.

Based on the results of U.S. patent application Ser. No. 17/728,869, the newly-recognized ability to perform VLE-PIXE on a FIB microscope with sensitivity comparable to conventional PIXE performed at much higher energies signifies a significant breakthrough in PIXE analysis. Nonetheless, the present inventors have recognized that additional modifications can uncover the full benefits of the of the VLE-PIXE technique. For example, the aforementioned patent application describes an experimental procedure in which a known FIB system comprising an inductively coupled plasma ion source, an associated gas mixing manifold and an FIB column may be modified so as to generate a single ion beam comprising both light and heavy ion species to be focused onto a sample surface. However, that document does not address the potential for employing alternative ion delivery methods. Further, the utilization of hydrogen as a reagent gas for generating $H^+$ ions presents a safety hazard. Although proton beams are commonly utilized to induce X-ray emission during PIXE analyses, Lestiani et al. [15] recently demonstrated, using a 4 MV Van de Graaff particle accelerator, that helium particle-induced X-ray emission was more suitable for detection of Na, Mg, Al, and Si than is traditional proton-induced X-ray emission.

Accordingly, there remains a need for development of additional methods, apparatuses and gas compositions for enhancement of PIXE X-Ray analyses at the relatively low ion beam energies (e.g., 50 kilo-electron-Volts, maximum) that are commonly available using existing focused ion beam apparatuses as well dual-beam apparatuses that include an electron microscope column in addition to a focused ion beam column.

SUMMARY

In light of the above background, the inventors have addressed the above need in the art through development of alternative beam delivery configurations and additional ion beam compositions. If the PIXE signal is collected during FIB milling, this leads to the possibility of end-point detection and real-time elemental mapping which can be utilized in 3D tomography workflows.

In accordance with a first aspect of the invention, a method of Particle-Induced X-Ray Emission (PIXE) analysis is provided, the method comprising:

- delivering a first ion beam from a first ion source and comprising ions having a first composition onto an area of a sample, wherein the kinetic energy of the ions is not greater than 50 kilo-electron-Volts (keV);
- simultaneously with the delivering of the first ion beam onto the sample area, delivering a second ion beam from a second ion source onto the sample area, the second ion beam comprising ions having a second composition, wherein the kinetic energy of the ions of the second ion beam is not greater than 50 kilo-electron-Volts (keV); and
- detecting X-rays that are emitted from the sample area in response to the simultaneous delivery of the first and second ion beams thereto.

In accordance with a second aspect of the invention, a second method of Particle-Induced X-Ray Emission (PIXE) analysis is provided, the second method comprising:

- delivering a plurality of pulses of first ions from a first ion source and comprising ions having a first composition onto an area of a sample, wherein the kinetic energy of the first ions is not greater than 50 kilo-electron-Volts (keV);
- simultaneously with the delivering of the plurality of pulses of first ions onto the sample area, delivering a plurality of pulses of second ions from a second ion source onto the sample area, the second ion beam comprising ions having a second composition, wherein the kinetic energy of the ions of the second ion beam is not greater than 50 kilo-electron-Volts (keV); and
- detecting and measuring X-rays that are emitted from the sample area in response to the impingement of the pulses of the first and second ions thereto.

In accordance with a third aspect of the invention, an analytical apparatus is provided, the apparatus comprising:

- a first ion beam column comprising a first ion source and configured to deliver a first ion beam comprising ions having a first composition onto an area of a sample, whereby the delivered ions have kinetic energy that is not greater than 50 kilo-electron-Volts (keV);
- a second ion beam column comprising a second ion source and configured to, simultaneously with the delivering of the first ion beam onto the sample area, deliver a second ion beam comprising ions having a second composition onto the sample area, whereby the delivered ions of the second ion beam have kinetic energy that is not greater than 50 keV; and an X-ray detector configured to detect X-rays that are emitted from the sample area in response to the simultaneous delivery of the first and second ion beams thereto.

BRIEF DESCRIPTION OF THE DRAWINGS

The above noted and various other aspects of the present invention will become apparent from the following description which is given by way of example only and with reference to the accompanying drawings, not necessarily drawn to scale, in which.

DETAILED DESCRIPTION

Figure 1A:
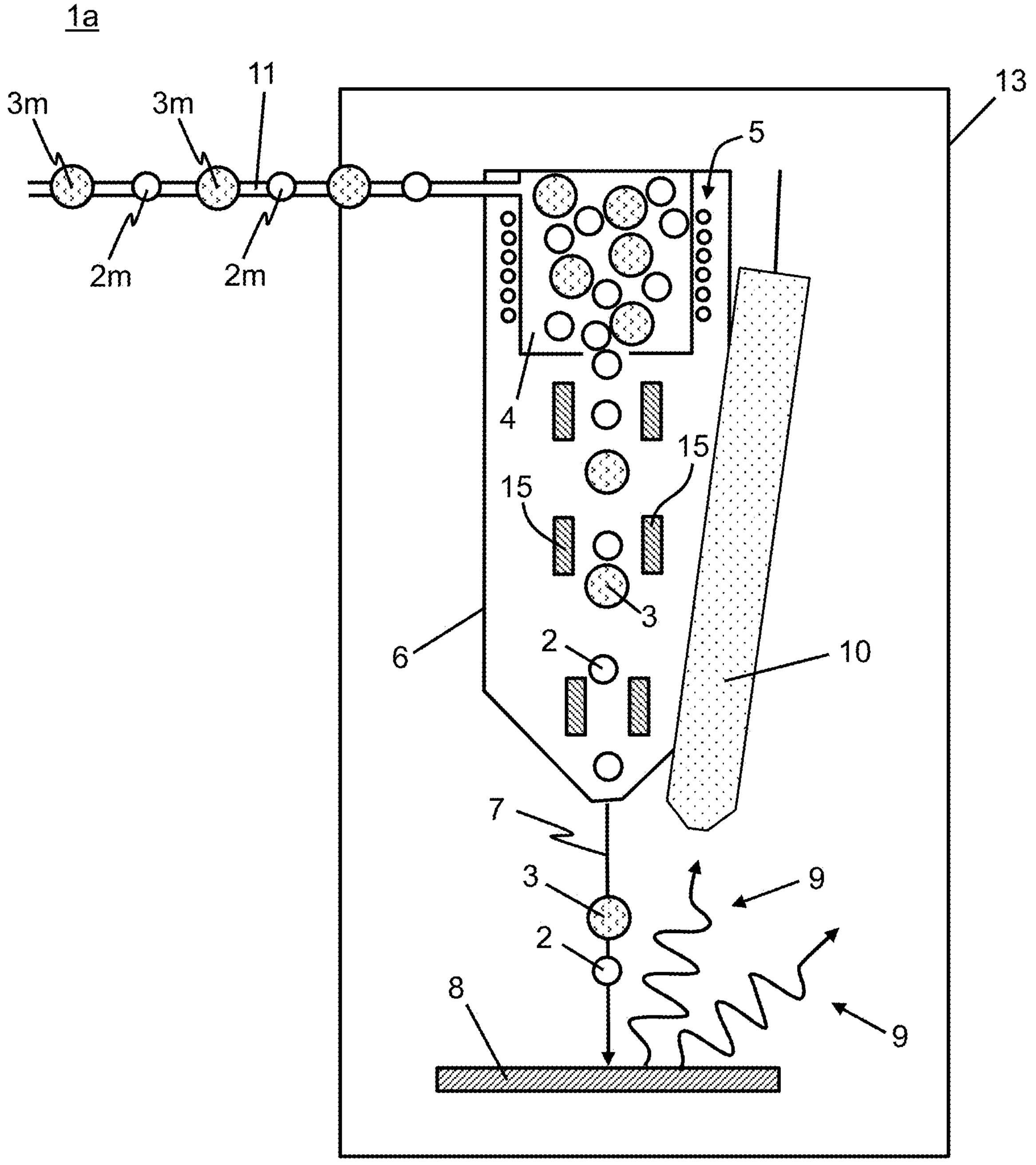
FIG. 1A is a schematic depiction of a previously described apparatus for performing Very Low Energy Particle-Induced X-ray Emission (VLE-PIXE) measurements, the apparatus comprising a focused ion beam (FIB) column, a plasma ion source that is adapted to generate ions from a mixture of gases and to provide the ions to the FIB column, and an X-Ray detector.
Figure 1B:
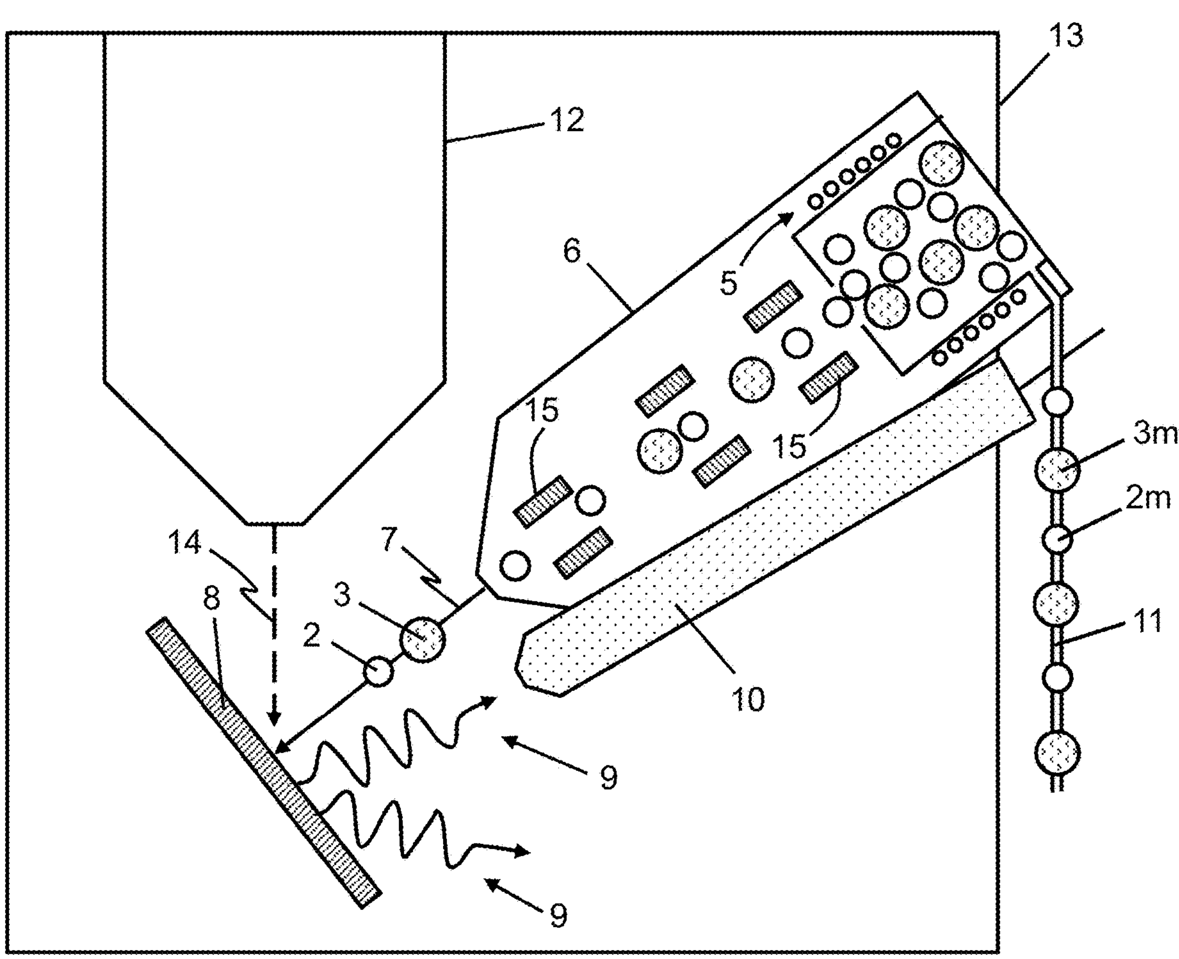
FIG. 1B is a schematic depiction of a previously described dual-beam apparatus for performing VLE-PIXE measurements, the apparatus comprising an FIB column, a scanning-electron microscope column, a plasma ion source that is adapted to generate ions from a mixture of gases and to provide the ions to the FIB column, and an X-ray detector.
Figure 1C:
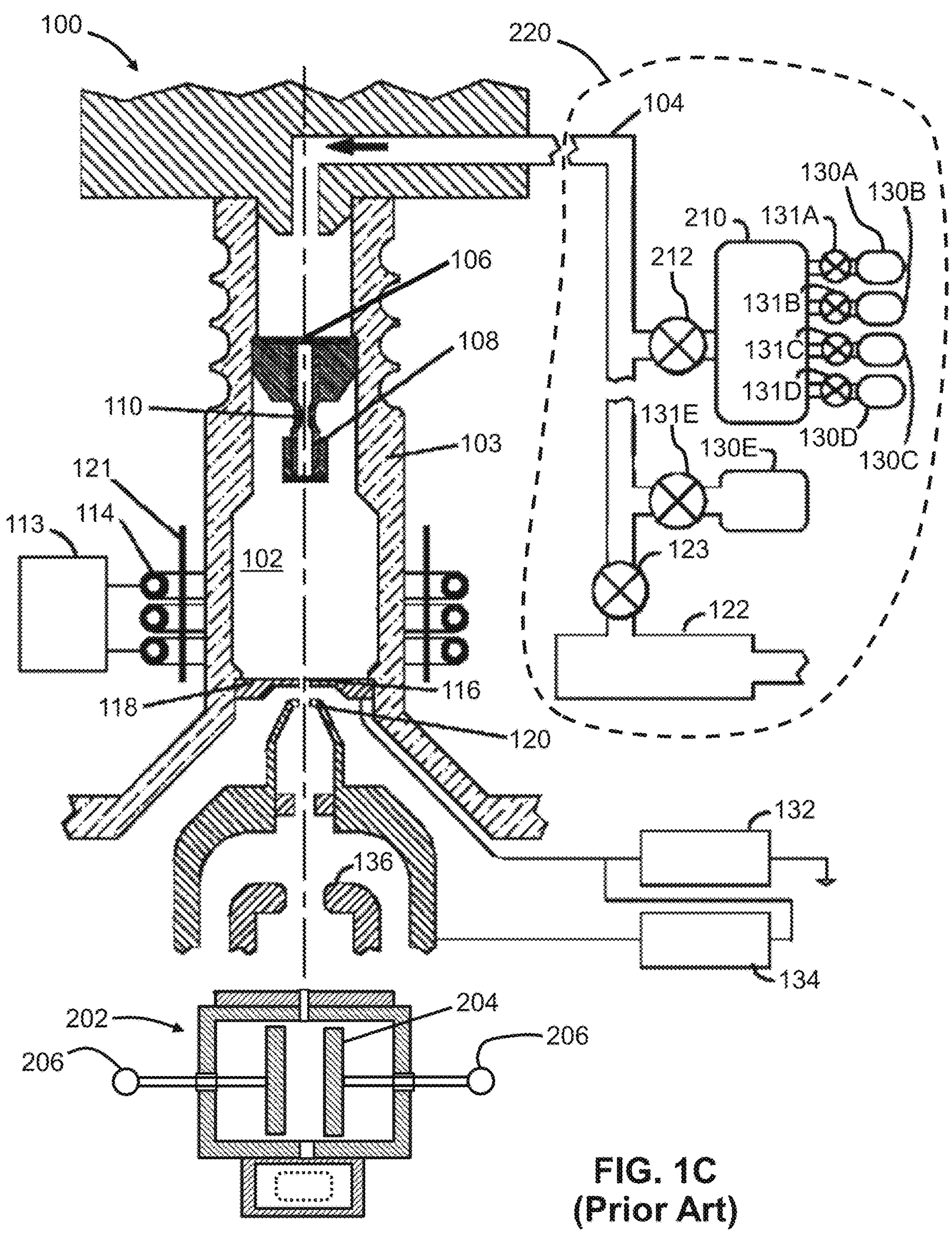
FIG. 1C is a schematic depiction of a known inductively coupled plasma ion source for generating ions and providing the generated ions to an FIB column.
Figure 2A:
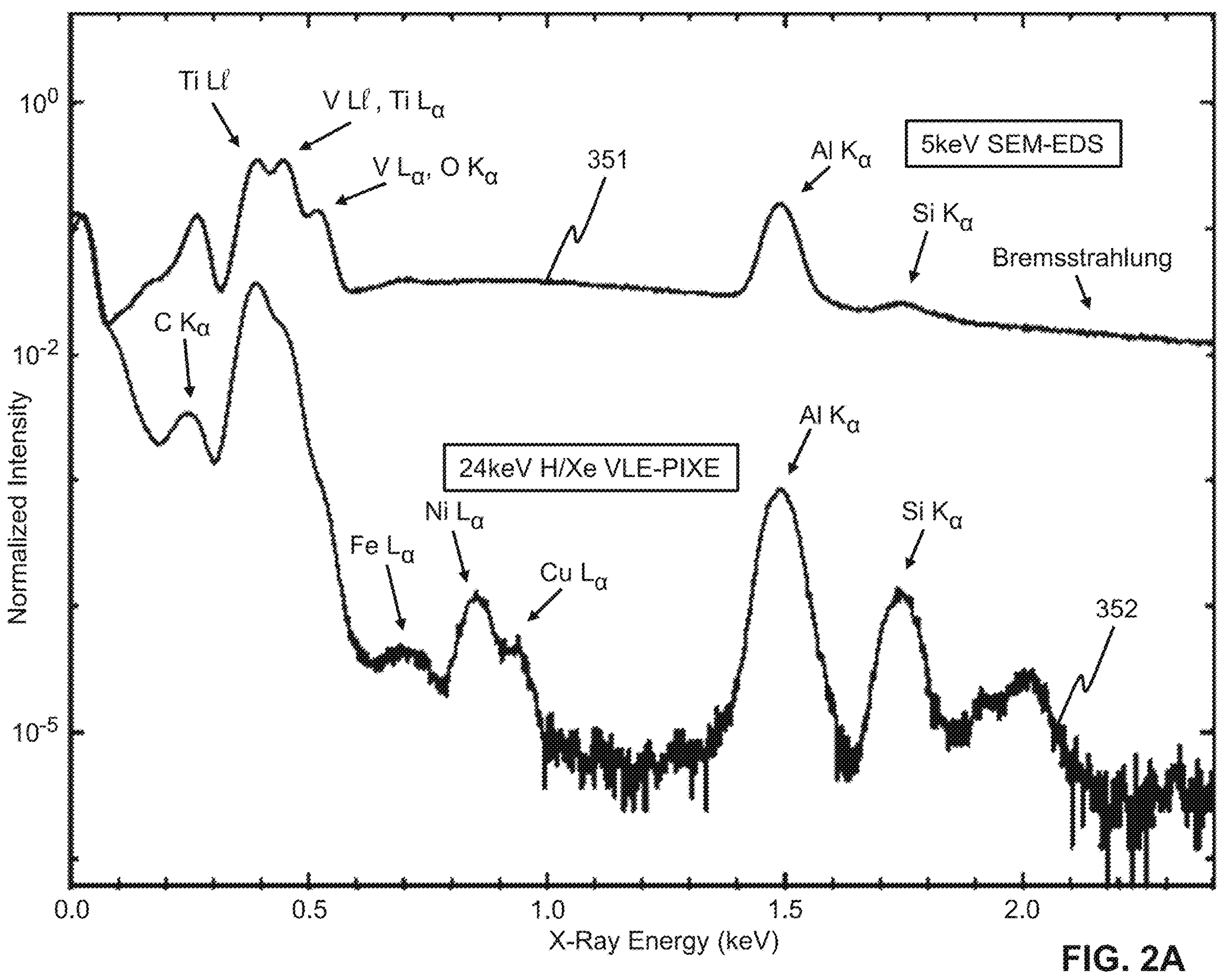
FIG. 2A is a comparison between a 24 keV VLE-PIXE spectrum of NIST Standard Reference Material SRM 654b and a 5 keV SEM-EDS spectrum of the same sample.
Figure 2B:
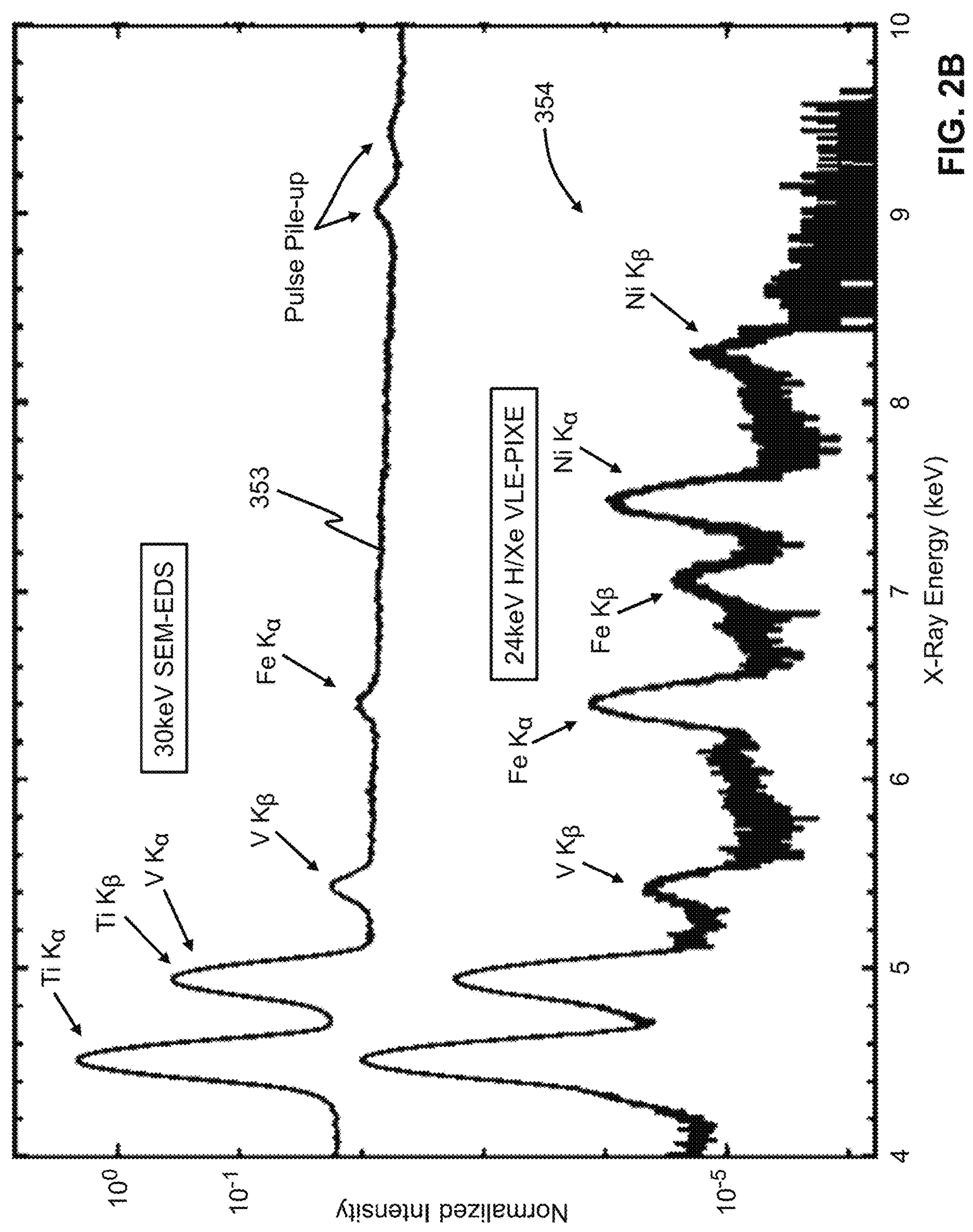
FIG. 2B is a comparison between a 24 keV VLE-PIXE spectrum of NIST Standard Reference Material SRM 654b and a 30 keV SEM-EDS spectrum of the same sample.
Figure 3A:
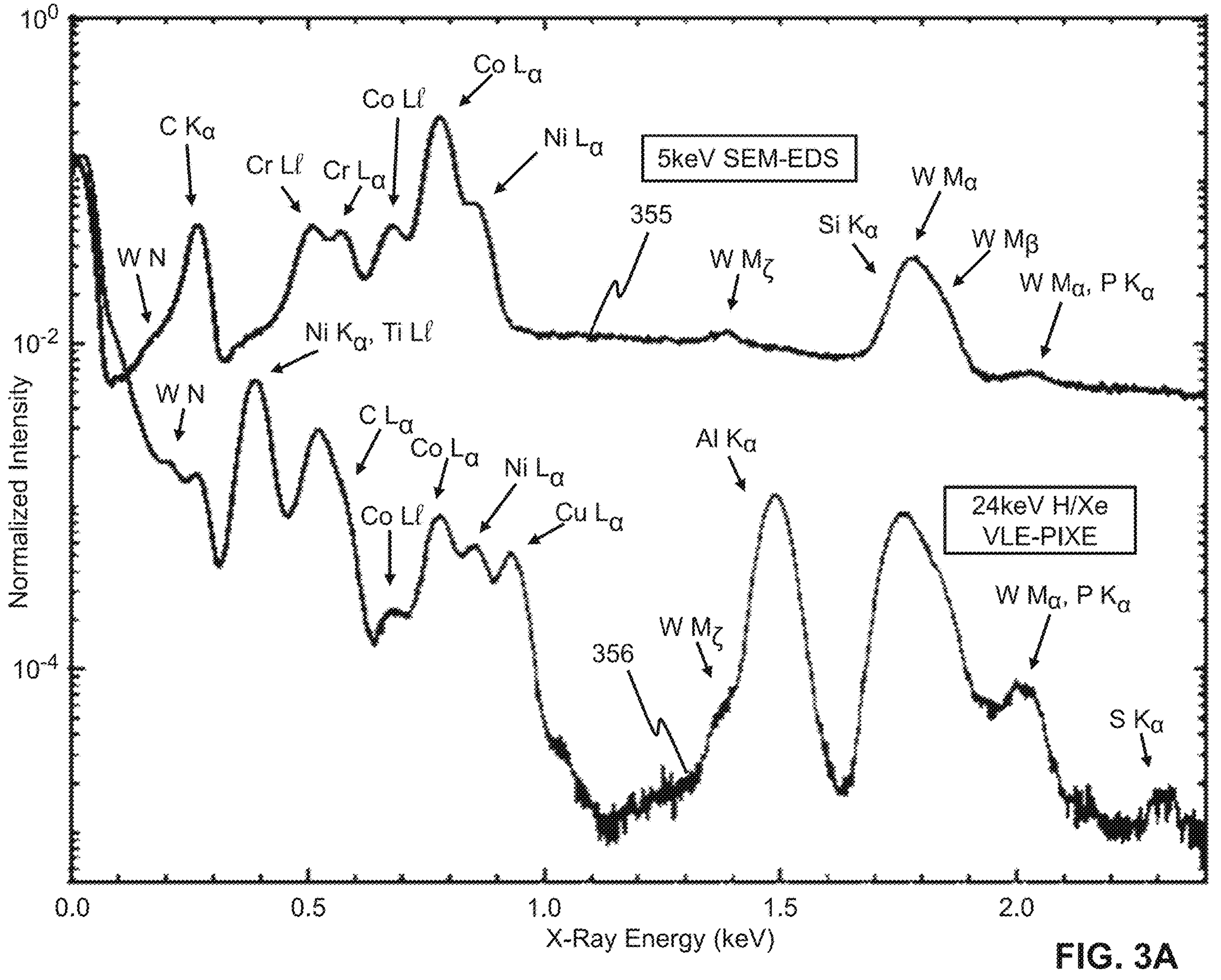
FIG. 3A is a comparison between a 24 keV VLE-PIXE spectrum of NIST Standard Reference Material SRM 1242 and a 5 keV SEM-EDS spectrum of the same sample.
Figure 3B:
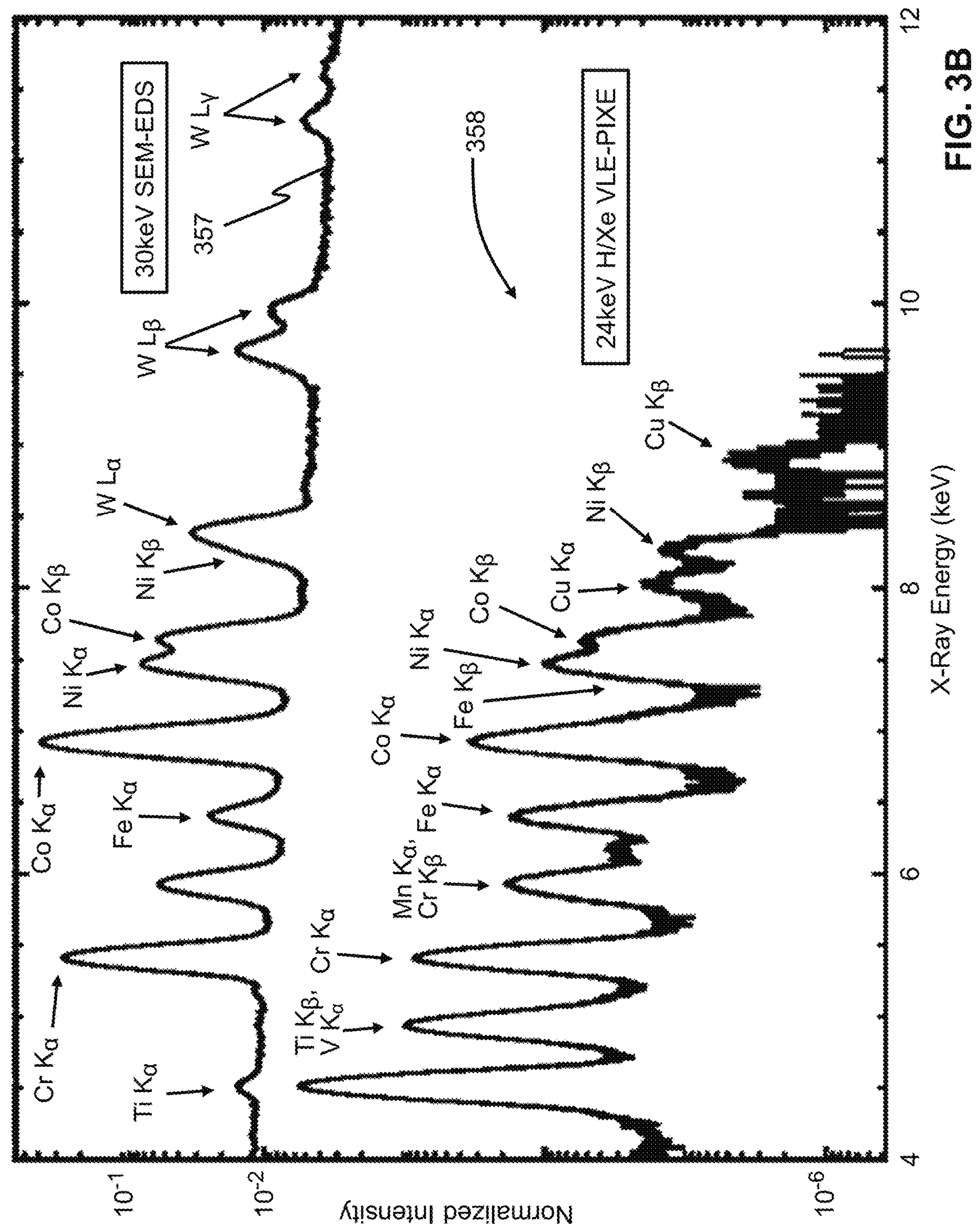
FIG. 3B is a comparison between a 24 keV VLE-PIXE spectrum of NIST Standard Reference Material SRM 1242 and a 30 keV SEM-EDS spectrum of the same sample.
Figure 4:
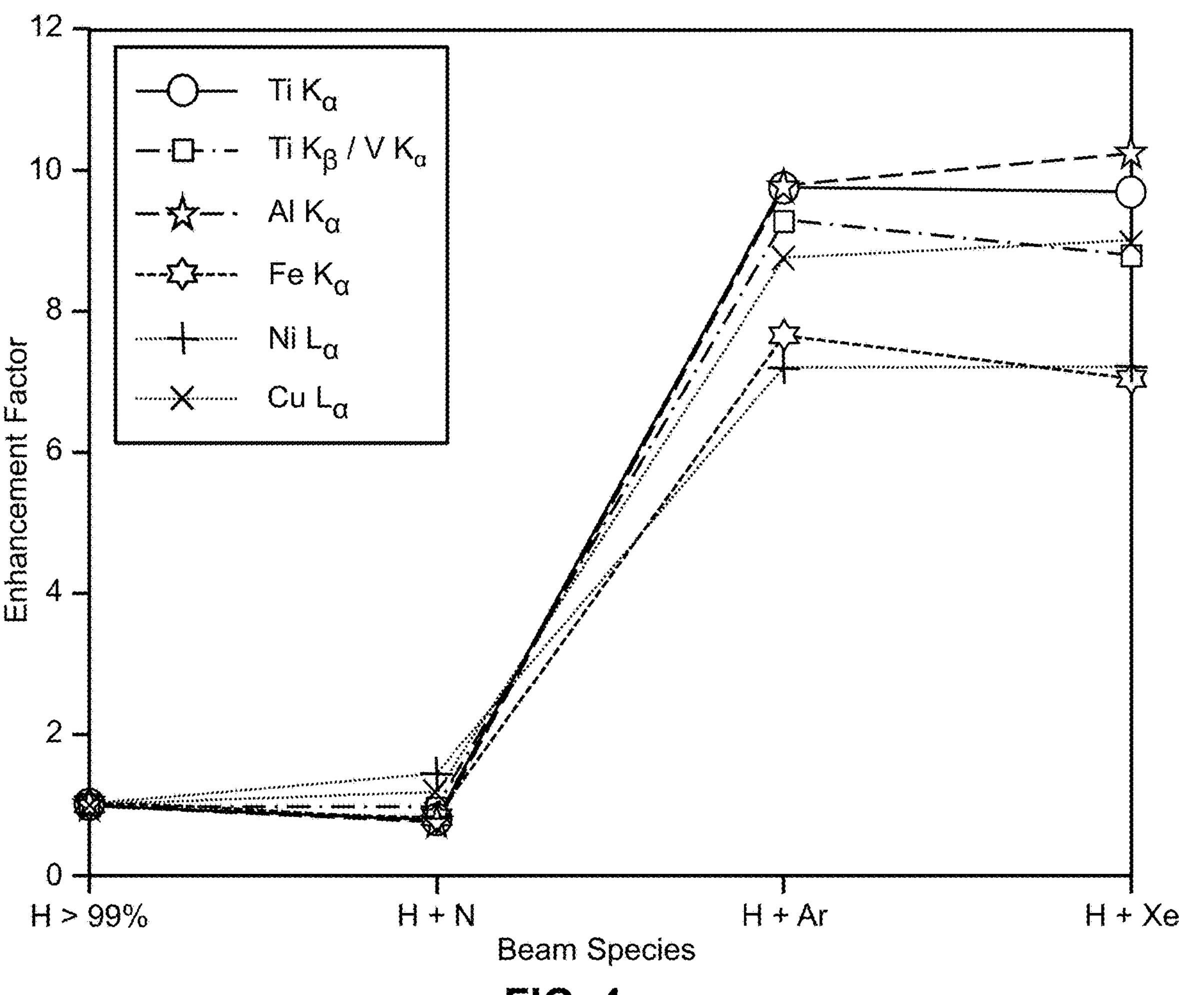
FIG. 4 is a graphical representation of X-ray signal enhancement factors, relative to an ion beam composed of >99% hydrogen, of several X-ray peaks of NIST Standard Reference Material SRM 654b, as observed for light doping of the beam with nitrogen, argon and xenon dopants.
Figure 5:
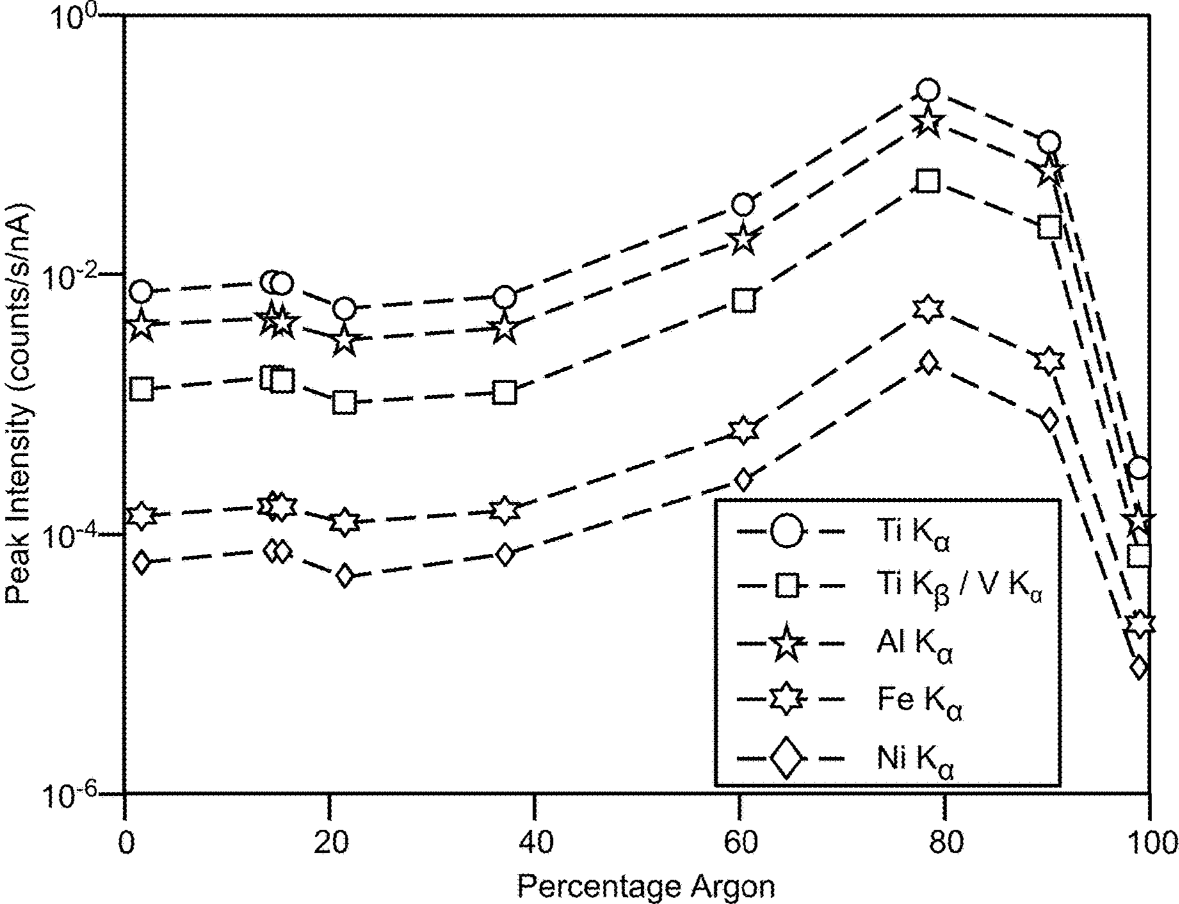
FIG. 5 is a plot of the measured intensities of some prominent X-ray peaks generated by repeated exposure of a sample of NIST Standard Reference Material SRM 654b to hydrogen ion beams having progressively decreasing percentages of Ar dopant, the Ar percentages controlled by repeated plasma source evacuation cycles.
Figure 6:
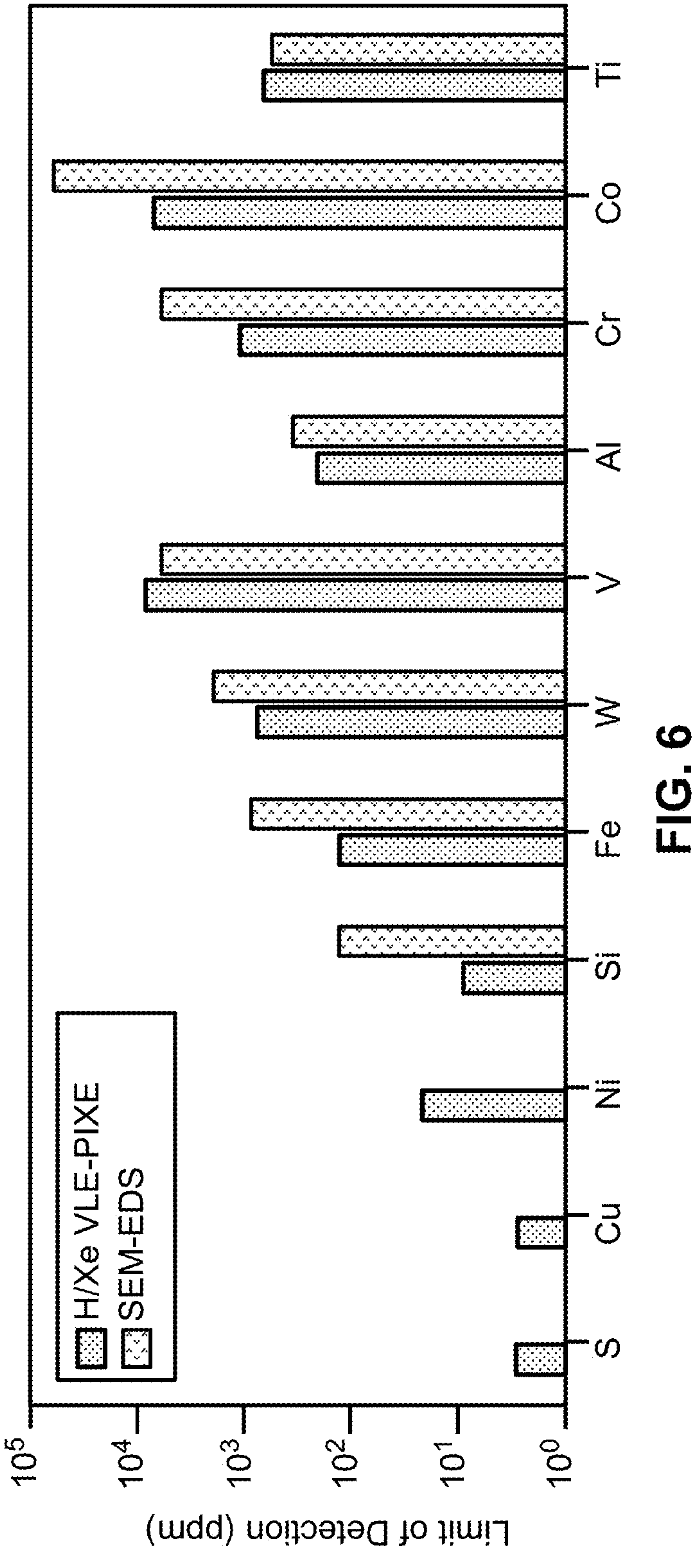
FIG. 6 is histogram that compares lower limits of detection of several elements in NIST Standard Reference Material SRM 654b, as determined by SEM-EDS to the lower limits of detection of the same elements as determined by Xe-doped hydrogen ion VLE PIXE.

The following description is presented to enable any person skilled in the art to make and use the invention, and is provided in the context of a particular application and its requirements. Various modifications to the described embodiments will be readily apparent to those skilled in the art and the generic principles herein may be applied to other embodiments. Thus, the present invention is not intended to be limited to the embodiments and examples shown but is to be accorded the widest possible scope in accordance with the features and principles shown and described. To fully appreciate the features of the present invention in greater detail, please refer to FIGS. 1A-18 in conjunction with the following description.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that, for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of candidates or alternatives is merely illustrative, not limiting, unless implicitly or explicitly understood or stated otherwise.

Figure 7A:
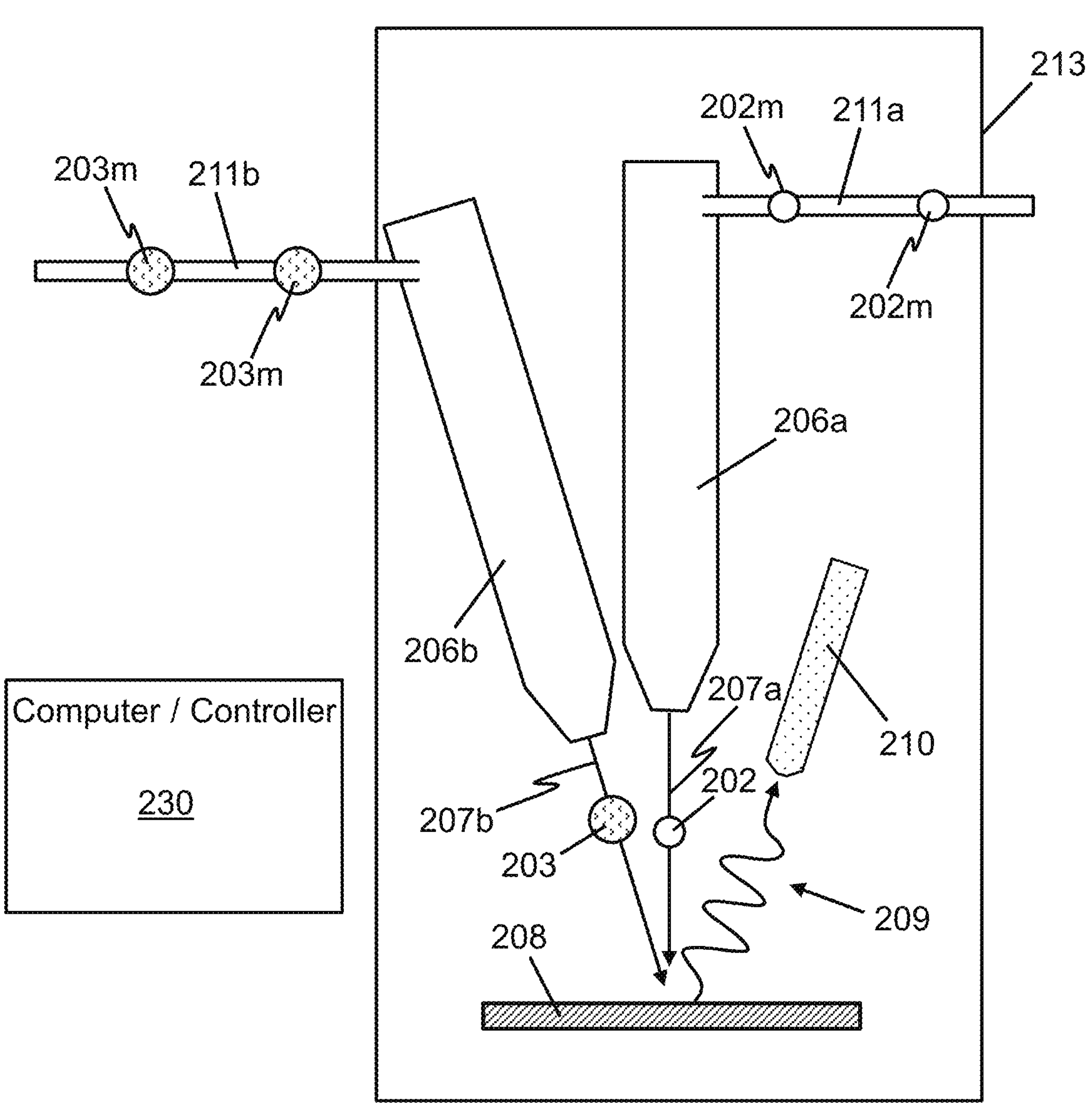
FIG. 7A is a schematic depiction of a first apparatus for performing Very Low Energy Particle-Induced X-ray Emission (VLE-PIXE) measurements in accordance with the present teachings.

FIG. 7A is a schematic depiction of a first system 200*a* for performing Very Low Energy Particle-Induced X-ray Emission (VLE-PIXE) measurements in accordance with the present teachings. The system 200*a* comprises a first ion beam column 206*a* and a second ion beam column 206*b* that are disposed within a vacuum chamber 213. Each ion beam column comprises a respective ionization source (not shown) that generates ions from a received reagent material. For example, FIG. 7A depicts the delivery of two gaseous reagent materials 202*m*, 203*m* having different compositions, to the ion beam columns 206*a*, 296*b*, respectively, through gas inlet tubes 211*a* and 211*b*. In some embodiments, the gaseous reagent material 202*m* may be chosen from among hydrogen, helium and mixtures thereof and the gaseous reagent material 203*m* may be chosen from among nitrogen, the noble gases and various mixtures thereof. The not-illustrated ion sources of the two columns generate ions 202 and 203 from the reagent materials 202*m* and 203*m*, respectively. Each ion source may comprise any suitable type of ion source, such as an inductively-coupled plasma ion source, an electron-impact ionization source, etc. The two ion sources need not be of the same type.

Each ion beam column comprises, in addition to an ion source, a plurality of accelerator electrodes, ion condenser lenses, apertures, and/or deflector lenses that direct each set of generated ions 202, 203 through the respective column 206*a*, 206*b* as a respective ion beam 207*a*, 207*b* towards a common target area on a sample 208. Furthermore, the ion optics of each ion beam column 206*a*, 206*b* may be operated to eliminate ions from each ion beam 207*a*, 207*b* that are other than a desired charge state. Generally, but not necessarily, the ion beam columns comprise focused ion beam (FIB) columns. In such cases, each ion beam column also comprises one or more objective lenses which may be operated to focus the ion beams onto the target area. Otherwise, if the columns are not FIB columns, then the beams that are directed onto the sample may be collimated or even divergent but not focused. The same effect may be achieved using FIB columns by refraining from activating the focusing lenses. Collimated or divergent ion beams may be employed to cause one or more ion beams to interact with a specific area of interest on a sample surface. Collimated or divergent beams may also be employed to control the flux density of ions delivered onto a given sample area.

The system 200*a* (FIG. 7A) also includes an X-ray detector 210 that is configured to detect X-ray emission from the target area of the sample 208 that is stimulated by the simultaneous or nearly simultaneous impingement of the different-composition ion beams 207*a*, 207*b* onto the target area. As noted by the inventors of the aforementioned U.S. patent application Ser. No. 17/728,869, the quantity of X-ray photons that are detected during such operation is generally significantly greater than would be detected by impingement of either one of the two beams separately. Moreover, the quantity of X-ray photons that are detected during the simultaneous or near-simultaneous impingement of the two beams 207*a*, 207*b* is significantly greater that the algebraic summation of the X-ray photons that would otherwise be detected by separate impingement of the two ion beams onto the sample.

To investigate the X-ray spectral effects of "near-simultaneous" impingement of two ion beams onto a target area, the two ion beams 207*a*, 207*b* may be pulsed, with each ion beam pulse comprising a packet of ions whose emission from an ion beam column is separated in time from both an earlier preceding packet and a subsequent following packet. The pulses may be created by operating deflector electrodes (not shown) within each ion beam column so as to periodically blank each ion beam. Upon allowance for travel time from an ion outlet of each column to the target area, the delivery times, onto the target area, of the packets from the two columns may fully overlap, may partially overlap or may not overlap. By varying the timings of two sets of pulses, various phase shifts of the pulse arrival waveforms may be introduced. These phase shifts may be adjusted so as to maximize the resulting X-ray emission signal.

The system 200*a* further comprises one or more computers or electronic controllers 230 that are electrically coupled to the columns (e.g., to the ion sources, ion lenses and other electrodes thereof), to the X-ray detector 210 as well as to other not-illustrated components (e.g., actuators to move a sample stage, vacuum pumps, etc.) for the purpose of executing analytical procedures. In particular, the one or more computers or electronic controllers 230 may comprise or have access to software or firmware that enables the system to carry out VLE-PIXE analyses in accordance with methods that are taught herein. Accordingly, the one or more computers or electronic controllers 230 may include or have access to a non-transitory computer readable medium comprising instructions which, when executed by one or more hardware processors, operate to execute the methods. For example, the instructions, when executed may, inter alia, control the phase shift between the pulse-arrival-time waveforms of two pulsed ion beams that that are delivered to a common area of a sample. Further, the instructions, when executed may receive and analyze a signal received from the detector 210 and adjust the phase shift in order to maximize the signal.

Figure 7B:
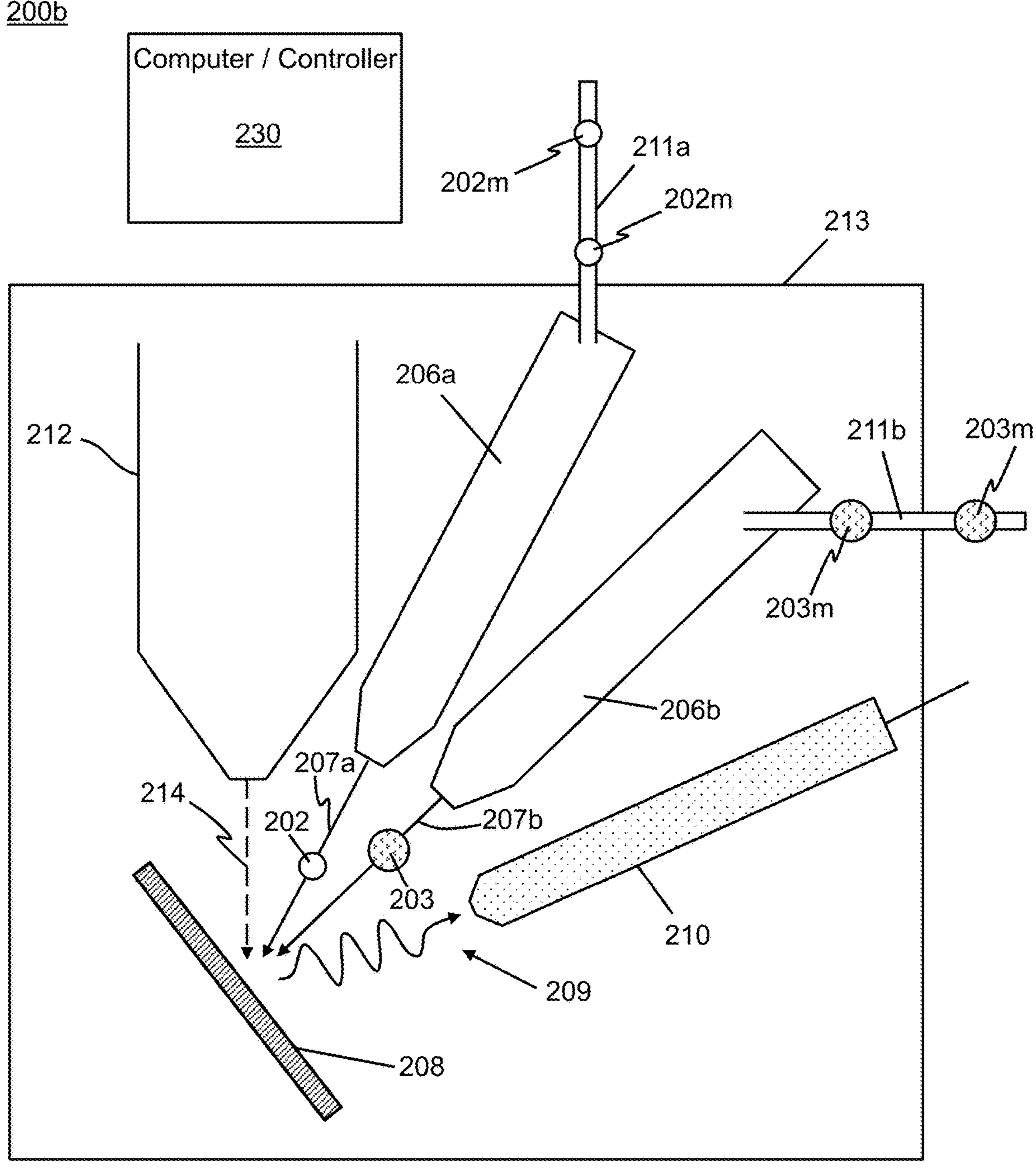
FIG. 7B is a schematic depiction of a second apparatus for performing VLE-PIXE measurements in accordance with the present teachings.

FIG. 7B is a schematic depiction of a second system 200*b* for performing VLE-PIXE measurements in accordance with the present teachings. The system 200*b* differs from the system 200*a* (FIG. 7A) through the additional inclusion of an electron microscope column 212 within the vacuum system 213. The system 200*b* provides the additional capability, relative to the system 200*a*, of using at least one of the ion beam columns 206*a*, 206*b* to mill a sample and, in turn, inspecting the milling progress at high magnification using the electron microscope column 212.

Figure 8A:
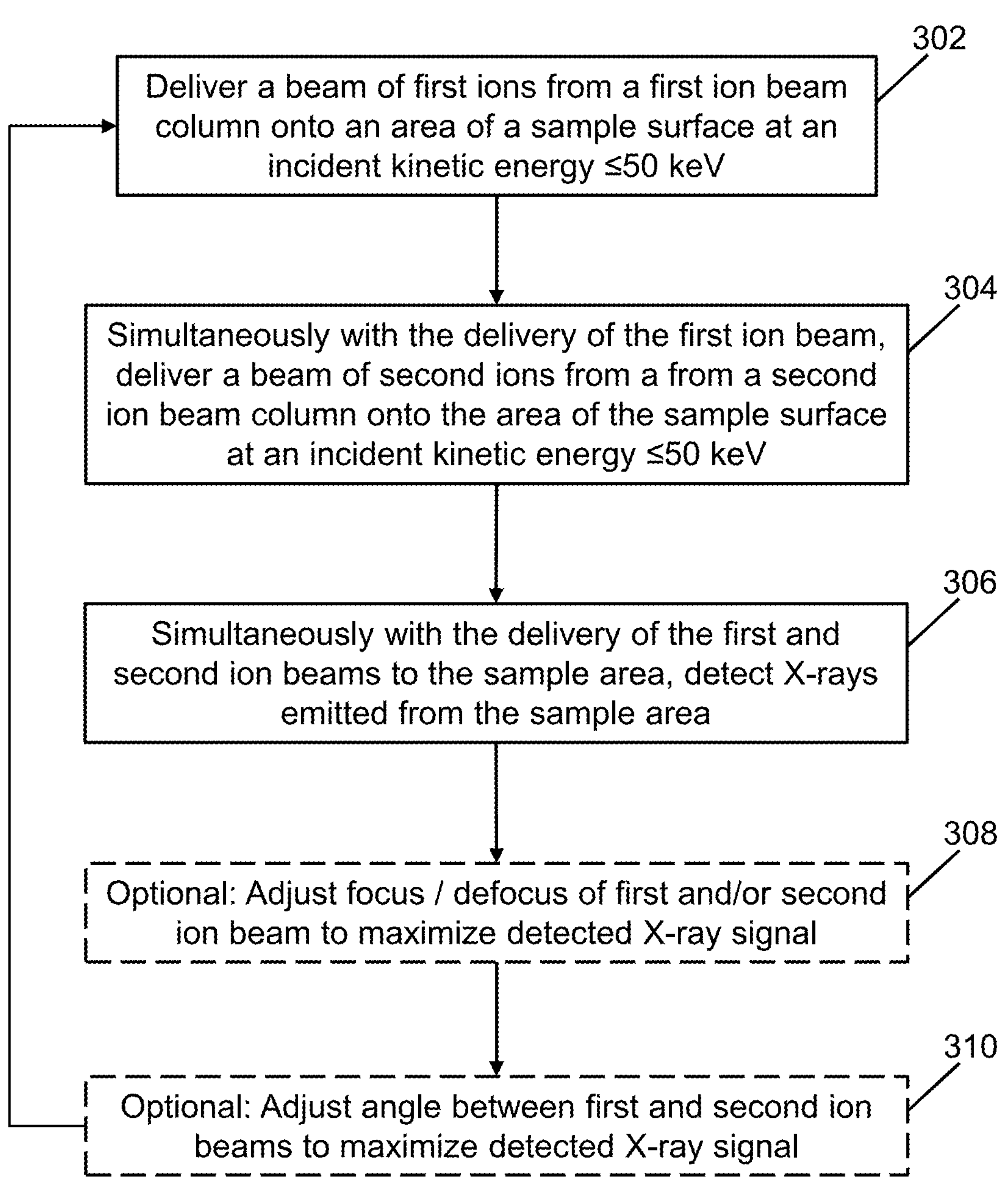
FIG. 8A is a flow diagram of a first method for performing VLE-PIXE measurements in accordance with the present teachings.

FIG. 8A is a flow diagram of a first method 300 for performing VLE-PIXE measurements in accordance with the present teachings. The first step, step 302 of the method 300 comprises delivering a beam of first ions (e.g., ion beam 207*a* shown in FIG. 7A) from a first ion beam column (e.g., column 206*a* shown in FIG. 7A) onto an area of a sample surface at an incident kinetic energy ≤50 keV. In step 304, a beam of second ions (e.g., ion beam 207*b*) from a from a second ion beam column (e.g., column 206*b*) is delivered onto the same area of the sample surface at an incident kinetic energy ≤50 keV. Accordingly, the steps 302 and 304 are executed simultaneously. The two ion beams comprise different respective ion compositions and may also comprise different ion charge states.

Step 306 comprises detecting X-rays emitted from the sample area simultaneously with the delivery of the first and second ion beams to the sample area. Accordingly, steps 302, 304 and 306 are all executed simultaneously. Steps 308 and 310 are optional adjustment steps that may occur either simultaneously with or subsequent to an execution of steps 302, 304 and 306. In step 308, focusing and/or defocusing at least one of the first and second ion beams is performed in order to maximize a detected X-ray signal. In step 310, the angle between first and second ion beams 207*a*, 207*b* may be adjusted to maximize detected X-ray signal. This step may be performed manually. Alternatively, if at least one of the ion beam columns is affixed to a moveable mounting structure (not shown) whose position is under the control of a motor or actuator that is under the control of the one or more computers or electronic controllers 230, then the step 310 may be performed automatically. Subsequent to the adjustments, execution of the method may resume (or may continue) with further simultaneous execution of the steps 302, 304 and 306, using the adjusted settings.

Figure 8B:
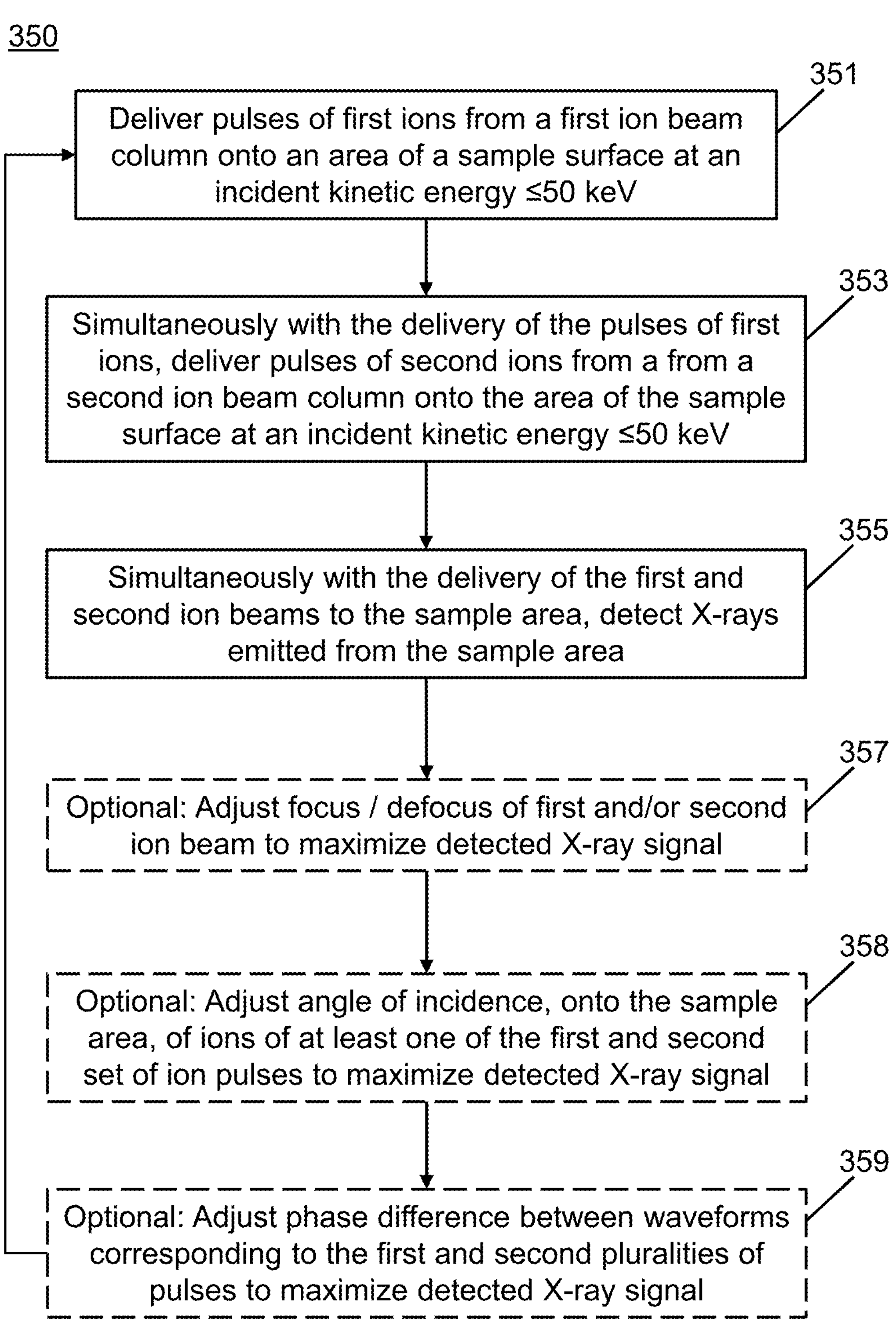
FIG. 8B is a flow diagram of a second method for performing VLE-PIXE measurements in accordance with the present teachings.

FIG. 8B is a flow diagram of a second method 350 for performing VLE-PIXE measurements in accordance with the present teachings. The method 350 differs from the method 300 (FIG. 8A) in that the method 350 pertains to the delivery of first and second pluralities of ion pulses (i.e., pulsed ion beams) to a sample area. Accordingly, the method 350 comprises one additional optional adjustment step, step 359, in which the adjustment relates to a phase difference between a waveform that corresponds to the first plurality of pulses and another waveform that corresponds to the second plurality of pulses.

The discussion included in this application is intended to serve as a basic description. The present invention is not intended to be limited in scope by the specific embodiments described herein, which are intended as single illustrations of individual aspects of the invention. Functionally equivalent methods and components are within the scope of the invention. Various other modifications of the invention, in addition to those shown and described herein will become apparent to those skilled in the art from the foregoing description and accompanying drawings. Specific numerical values of apparatus operating parameters presented herein are provided as typical operating parameters, as determined for specific apparatus, and are not intended to be limiting in any way.

BIBLIOGRAPHY

[1] Young, Richard J., and Mary V. Moore. Dual-beam (FIB-SEM) systems. *Introduction to focused ion beams*. Springer, Boston, MA, 2005. 247-268.

[2] McLean P Echlin, Marcus Straw, Steven Randolph, Jorge Filevich, and Tresa M Pollock. The TriBeam system: Femtosecond laser ablation in situ SEM. *Materials Characterization,* 100:1-12, 2015.

[3] Yongqi Fu and Kok Ann Bryan Ngoi. Focused ion beam direct fabrication of micro-optical elements: features compared with laser beam and electron beam direct writing, 2004.

[4] Lucille A Giannuzzi et al. *Introduction to focused ion beams: instrumentation, theory, techniques and practice*. Springer Science & Business Media, 2004.

[5] Lucille A Giannuzzi and Frederick A Stevie. A review of focused ion beam milling techniques for TEM specimen preparation. *Micron,* 30(3):197-204, 1999.

[6] Richard Young, C Rue, S Randolph, C Chandler, G Franz, R Schampers, A Klumpp, and L Kwakman. A comparison of xenon plasma FIB technology with conventional gallium LMIS FIB: imaging, milling, and gas-assisted applications. *Microscopy and Microanalysis,* 17(S2):652-653, 2011.

[7] TL Burnett, R Kelley, B Winiarski, L Contreras, M Daly, A Gholinia, M G Burke, and PJ Withers. Large volume serial section tomography by Xe Plasma FIB dual beam microscopy. *Ultramicroscopy,* 161:119-129, 2016.

[8] Sven A E Johansson and Thomas B Johansson. Analytical application of particle induced X-ray emission. *Nuclear Instruments and Methods,* 137(3):473-516, 1976.

[9] C G Ryan. Quantitative trace element imaging using PIXE and the nuclear microprobe. *International Journal of Imaging Systems and Technology,* 11(4):219-230, 2000.

[10] Dale Newbury, Nicholas Ritchie, Michael Mengason, and Keana Scott. SEM/EDS Trace Analysis: Limits Imposed by Fluorescence of the Detector. *Microscopy and Microanalysis,* 23(S1):1026-1027, 2017.

[11] Rainer Siegele, David D Cohen, and Nick Dytlewski. The ANSTO high energy heavy ion microprobe. *Nuclear Instruments and Methods in Physics Research Section B: Beam Interactions with Materials and Atoms,* 158(14): 31-38, 1999.

[12] A Denker, J Opitz Coutureau, M Griesser, R Denk, and H Winter. Nondestructive analysis of coins using high-energy PIXE. *Nuclear Instruments and Methods in Physics Research Section B: Beam Interactions with Materials and Atoms,* 226(1-2):163-171, 2004.

[13] K Ishii and S Morita. Theoretical estimation of PIXE detection limits. *Nuclear Instruments and Methods in Physics Research Section B: Beam Interactions with Materials and Atoms,* 34(2):209-216, 1988.

[14] Keizo Ishii and Susumu Morita. Continuous backgrounds in PIXE. *International Journal of PIXE,* 1(01): 1-29, 1990.

[15] Lestiani, Diah Dwiana, Sung Kijin, Muhayatun Santoso, and Ikuji Takagi. "Helium and Proton Particle-Induced X-Ray Emission (PIXE) for Characterization of PM2.5 from Surabaya, Indonesia." *Analytical Letters* (2023): 1-14.

What is claimed is:

1. A method of Particle-Induced X-Ray Emission (PIXE) analysis comprising:

delivering a first ion beam from a first ion source and comprising ions having a first composition onto an area of a sample, wherein the kinetic energy of the ions is not greater than 50 kilo-electron-Volts (keV);

simultaneously with the delivering of the first ion beam onto the sample area, delivering a second ion beam from a second ion source onto the sample area, the second ion beam comprising ions having a second composition, wherein the kinetic energy of the ions of the second ion beam is not greater than 50 kilo-electron-Volts (keV); and detecting X-rays that are emitted from the sample area in response to the simultaneous delivery of the first and second ion beams thereto.

2. A method of PIXE analysis as recited in claim 1, further comprising focusing at least one of the first and second ion beams onto the sample area.

3. A method of PIXE analysis as recited in claim 1, further comprising adjusting an angle between the first and second ion beams such that a magnitude of a detected X-ray signal is maximized by the adjusting.

4. A method of PIXE analysis as recited in claim 1, wherein the first ion beam comprises either protons or helium ions or a mixture thereof and wherein the second ion beam comprises ions having greater mass than the ions of the first ion beam.

5. A method of PIXE analysis as recited in claim 1, wherein the second ion beam comprises ions of either nitrogen, argon or xenon or a mixture thereof.

6. A method of PIXE analysis as recited in claim 1, wherein the first ion beam is delivered from a first focused ion beam column and the second ion beam is delivered from a second focused ion beam column.

7. A method of Particle-Induced X-Ray Emission (PIXE) analysis comprising:

delivering a plurality of pulses of first ions from a first ion source and comprising ions having a first composition onto an area of a sample, wherein the kinetic energy of the first ions is not greater than 50 kilo-electron-Volts (keV);

simultaneously with the delivering of the plurality of pulses of first ions onto the sample area, delivering a plurality of pulses of second ions from a second ion source onto the sample area, the second ion beam comprising ions having a second composition, wherein the kinetic energy of the ions of the second ion beam is not greater than 50 keV; and detecting and measuring X-rays that are emitted from the sample area in response to the impingement of the pulses of the first and second ions thereto.

8. A method of PIXE analysis as recited in claim 7, further comprising focusing at least one of the first plurality of ion pulses and the second plurality of ion pulses onto the sample area.

9. A method of PIXE analysis as recited in claim 7, further comprising adjusting an angle incidence, onto the sample area, of ions of at least one of the first and second pluralities of pulses such that a magnitude of a detected X-ray signal is maximized by the adjusting.

10. A method of PIXE analysis as recited in claim 7, further comprising adjusting a phase difference between the first and second pluralities of pulses such that a magnitude of a detected X-ray signal is maximized by the adjusting.

11. A method of PIXE analysis as recited in claim 7, wherein the ions of the first plurality of pulses comprise either protons or helium ions or a mixture thereof and wherein the ions of the second plurality of pulses having greater mass than the ions of the first plurality of pulses.

12. A method of PIXE analysis as recited in claim 7, wherein the ions of the second plurality of pulses comprise ions of either nitrogen, argon or xenon or a mixture thereof.

13. An analytical apparatus comprising:

a first ion beam column comprising a first ion source and configured to deliver a first ion beam comprising ions having a first composition onto an area of a sample, whereby the delivered ions have kinetic energy that is not greater than 50 kilo-electron-Volts (keV);

a second ion beam column comprising a second ion source and configured to, simultaneously with the delivering of the first ion beam onto the sample area, deliver a second ion beam comprising ions having a second composition onto the sample area, whereby the delivered ions of the second ion beam have kinetic energy that is not greater than 50 keV; and an X-ray detector configured to detect X-rays that are emitted from the sample area in response to the simultaneous delivery of the first and second ion beams thereto.

14. An analytical apparatus as recited in claim 13, wherein the apparatus is electrically coupled to a non-transitory computer readable medium comprising instructions which, when executed by one or more hardware processors, operate to:

cause ion lenses of the first or second ion beam columns to adjust focus of at least one of the first and second ion beams at the sample area, such that a magnitude of a detected X-ray signal is maximized by the adjusting.

15. An analytical apparatus as recited in claim 13, wherein the apparatus is electrically coupled to a non-transitory computer readable medium comprising instructions which, when executed by one or more hardware processors, operate to:

cause ion lenses of the first or second ion beam columns to adjust an angle of incidence, onto the sample area, of ions of at least one of the first and second ion beams such that a magnitude of a detected X-ray signal is maximized by the adjusting.

16. An analytical apparatus as recited in claim 13, wherein at least one of the first and second ion beam columns is a focused ion beam column.

17. An analytical apparatus as recited in claim 13, wherein the first ion beam column and first ion beam source are configured to deliver either protons or helium ions or a mixture thereof to the sample area and wherein the second ion beam column is configured to deliver ions to the sample area having greater mass than the protons or helium ions.

18. An analytical apparatus as recited in claim 17, wherein the second ion beam column and the second ion source are configured to deliver ions to the sample area that comprise either nitrogen, argon or xenon or a mixture thereof.

19. An analytical apparatus comprising:

a first ion beam column comprising a first ion source and configured to deliver a first plurality of pulses of ions having a first composition onto an area of a sample, whereby the delivered ions have kinetic energy that is not greater than 50 kilo-electron-Volts (keV);

a second ion beam column comprising a second ion source and configured to, simultaneously with the delivering of the first plurality of pulses of ions having the first composition onto the sample area, deliver a second plurality of pulses comprising ions having a second composition onto the sample area, whereby the delivered ions of the second plurality of pulses have kinetic energy that is not greater than 50 keV; and an X-ray detector configured to detect X-rays that are emitted from the sample area in response to the simultaneous delivery of the first and second ion beams thereto.

20. An analytical apparatus as recited in claim 19 wherein the apparatus is electrically coupled to a non-transitory computer readable medium comprising instructions which, when executed by one or more hardware processors, operate to:

cause the first and second ion beam columns to control the timings of the first and second pluralities of pulses such that a phase difference between the first and second pluralities of pulses is adjusted.

* * * * *